US008110171B1

(12) United States Patent
Roy et al.

(10) Patent No.: US 8,110,171 B1
(45) Date of Patent: Feb. 7, 2012

(54) METHOD FOR DECOLORIZING DIAMONDS

(75) Inventors: Rustum Roy, University Park, PA (US); Rajneesh Bhandari, Jaipur (IN)

(73) Assignee: Rajneesh Bhandari (IN)

(*) Notice: Subject to any disclaimer, the term of this patent is extended or adjusted under 35 U.S.C. 154(b) by 614 days.

(21) Appl. No.: 11/599,865

(22) Filed: Nov. 15, 2006

Related U.S. Application Data

(60) Provisional application No. 60/737,555, filed on Nov. 17, 2005.

(51) Int. Cl.
*B01J 3/06* (2006.01)
*C01B 17/02* (2006.01)
*C23C 16/00* (2006.01)
*C30B 7/00* (2006.01)
*C30B 15/00* (2006.01)
*C30B 23/00* (2006.01)
*H01L 21/302* (2006.01)

(52) U.S. Cl. ............ 423/446; 423/264; 427/249.8; 117/68; 117/19; 117/84; 438/689

(58) Field of Classification Search ............ None
See application file for complete search history.

(56) References Cited

U.S. PATENT DOCUMENTS

| 4,399,364 A * | 8/1983 | Evans et al. ............ 250/492.1 |
| 5,084,909 A * | 1/1992 | Pollak ............ 378/64 |
| 5,451,430 A * | 9/1995 | Anthony et al. ............ 427/372.2 |
| 5,628,824 A * | 5/1997 | Vohra et al. ............ 117/101 |
| 6,692,714 B2 * | 2/2004 | Vagarali et al. ............ 423/264 |
| 2002/0172638 A1 | 11/2002 | Vagarali et al. |
| 2004/0175499 A1 * | 9/2004 | Twitchen et al. ............ 427/249.8 |

OTHER PUBLICATIONS

Very High Growth Rate Chemical Vapor Deposition of Single-Crystal Diamond; Applied Physical Sciences, PNAS; vol. 99, No. 20, pp. 12523-12525; Oct. 1, 2002.*
Investigation of Carbon near the Graphite-Diamond Liquid Triple Point; Physical Review Letters; vol. 69, No. 20, pp. 2991-2994; Nov. 16, 1992.*

* cited by examiner

*Primary Examiner* — Melvin Mayes
*Assistant Examiner* — Guinever Gregorio
(74) *Attorney, Agent, or Firm* — William L. Botjer

(57) ABSTRACT

A method for changing the color of a diamond. The method comprises placing the diamond in a substrate holder in a chemical vapor deposition (CVD) equipment. The CVD equipment is maintained at pressures near or below atmospheric pressure. A mixture of gases including hydrogen is introduced inside the CVD equipment. The introduced mixture of gases is energized by using microwave radiation to heat the diamond to temperatures above 1400° C. Then, the diamond is maintained at temperatures above 1400° C. for few seconds to few hours.

12 Claims, 7 Drawing Sheets

METHOD FOR DECOLORIZING DIAMONDS

RELATED APPLICATIONS

This application claims priority of U.S. provisional patent application No. 60/737,555, filed on Nov. 17, 2005.

BACKGROUND

The invention relates generally to the field of decolorizing of diamonds. More specifically, the invention relates to a method for decolorizing or altering the color of diamonds near or below atmospheric pressure.

A diamond is a crystalline allotrope of carbon. Diamonds are broadly classified into natural and synthetic diamonds, on the basis of their origin. A natural diamond is a diamond that is formed naturally in the earth by prolonged exposure of carbon-bearing materials to high pressure and temperature. Scientists have been able to produce synthetic diamonds in laboratory conditions, which have the same chemical composition and physical properties as natural diamonds.

Natural diamonds possess a color that ranges from clear and colorless to yellow, orange, red, pink, blue, green, brown, and even black. The four 'Cs', i.e., cut, color, clarity and carat size, generally determine the price of a diamond. However, the price of the diamond largely depends on the carat size and color of the diamond. In natural diamonds, brown-colored diamonds are most common and relatively inexpensive. Fancy-colored diamonds, and clear or colorless diamonds are highly priced, and are extensively used in making jewelry. Even the faintest tinge of yellow in colorless diamonds considerably reduces the price of the colorless diamonds.

Therefore, diamonds are decolorized to increase their aesthetic appeal and economic value. Low priced brown-colored diamonds are decolorized to colorless to increase their economic value.

Diamonds have been decolorized, until now, by using a High Pressure High Temperature (HPHT) process. In the HPHT process for decolorizing diamonds, the diamonds are placed in an HPHT press and exposed to high temperatures (mainly above 1700° C.), and high pressures (a few gigapascals). The diamonds in the HPHT process are generally maintained in the thermodynamic pressure-temperature (P-T) stability region of the diamond by applying sufficient pressure. This is done in order to prevent graphitization of the diamonds, which results in a re-arrangement of carbon atoms in the diamonds leading to a conversion of a diamond into graphite.

At high temperatures and high pressures maintained inside the HPHT press, the mobility of atoms in the diamond increases. The increased mobility of atoms leads to migration of nitrogen atoms present in the diamond (responsible for color of the diamonds) to form aggregates. The formation of aggregates of nitrogen from the nitrogen atoms contributes to the decolorizing of diamonds.

U.S. Pat. No. 4,399,364, titled 'Diamond Treatment' describes an HPHT method for reducing the color of type 1b diamonds. The method involves irradiating the type 1b diamonds by electron or neutron bombardment leading to atomic displacements in the diamond crystal. This is followed by heat-treating the irradiated diamonds at a temperature in the range of 1600° C.-2000° C. The diamond is heat treated in an HPHT apparatus at 80 Kbars. The period of heat treatment varies according to the degree of the desired reduction in the color.

U.S. Patent Publication Number US20020172638, titled 'High Pressure/High Temperature Production of Colorless and Fancy Colored Diamonds' also describes an HPHT method for improving color of a discolored natural diamond. The discolored natural diamond is heat treated in the elevated temperature range from 1500° C. to 2700° C. at pressures ranging from 5 GPa to 20 GPa. The diamond is heat treated for a time period ranging from 30 seconds to 500 hours.

However, one of the limitations of using HPHT process for decolorizing diamonds is that the HPHT press needs to be operated in the P-T stability region of the diamond. An inability to operate the HPHT press in the P-T stability region of the diamond results in the graphitization of the diamond, which reduces the economic value of the diamond. The outer surface of the diamond gets graphitized even when the HPHT press is operated in the P-T stability region of the diamond. The graphitization of the outer surface of the diamond results in the formation of a black layer on the outer surface of the diamond. Therefore, the diamond decolorized by the HPHT process needs to be repolished. Further, high pressures inside the HPHT press may lead to development of cracks in the diamond and frequent breakages of the diamond, i.e., the diamond is unable to survive high temperatures and pressures for a substantial period of time. Furthermore, the HPHT process for decolorizing diamonds is not very cost-effective, as some parts of the HPHT press suffer damage at high temperatures and pressures maintained inside the HPHT press. As a result, these parts of the HPHT press need to be replaced every time diamonds have to be decolorized. This increases the cost of operating the HPHT process.

In view of the foregoing discussion, there exists a need for a method for decolorizing of diamonds, which is able to produce clear or colorless diamonds without damaging the diamonds or damaging the system used for decolorizing of diamonds. Further, the cost of operating the method should be low. In addition, the method should enable decolorizing of the diamonds at pressures near or below atmospheric pressure in order to prevent development of cracks in the diamonds and breakages of the parts of the system used for decolorizing of diamonds. Further, the method should enable decolorizing of the diamonds without causing the graphitization of the diamonds. Furthermore, the method should prevent the need of repolishing the outer surface of the diamond. In addition, the method for decolorizing should result in uniform decolorization of the diamonds.

SUMMARY

An object of the invention is to provide a method for decolorizing diamonds near or below atmospheric pressure.

Another object of the invention is to provide a method for decolorizing diamonds using chemical vapor deposition (CVD) methodologies.

Still another object of the invention is to provide a method for changing the color of diamonds near or below atmospheric pressure using CVD methodologies.

Still another object of the invention is to provide a method for uniform decolorization of the diamonds.

Yet another object of the invention is to prevent cracks and breakages of diamond during the process of decolorizing of the diamonds.

Yet another object of the invention is to decolorize diamonds by heating the diamonds at high temperatures with microwave radiation in CVD equipment.

Yet another object of the invention is to decolorize diamonds by further heating the diamonds at high temperatures with laser energy in addition to heating the diamonds with microwave radiation in CVD equipment.

To achieve the above-mentioned objects, the invention provides a method for decolorizing or changing the color of diamonds near or below atmospheric pressure. According to the method, a diamond to be decolorized is held in a substrate holder. The diamond held in the substrate holder is placed in the CVD equipment. The CVD equipment is maintained near or below atmospheric pressure. A mixture of gases essentially containing hydrogen gas is introduced into the CVD equipment. The introduced mixture of gases is energized by using microwave radiation. The energizing of the introduced mixture of gases leads to splitting of hydrogen molecules to form atomic hydrogen plasma. The atomic hydrogen plasma so created, stabilizes the diamond, and raises the temperature of the diamond into the range of 1400° C. to 2400° C. In accordance with one embodiment of the invention, a plasma is created by adding argon with hydrogen gas as the carrier gas in the introduced mixture of gases.

In accordance with one embodiment of the invention, laser energy along with microwave radiation is used for further heating the diamond placed in the CVD equipment to temperatures in the range of 1600° C. to 2400° C.

A method in accordance with the invention enables decolorizing of diamonds in the CVD equipment without damaging the diamonds. The diamonds are decolorized by heating the diamonds in atomic hydrogen plasma. The atomic hydrogen plasma stabilizes the diamond, thereby preventing graphitization of the diamonds. This prevents the formation of a black layer on the outer surface of the diamonds. Therefore, there is no need of repolishing the outer surface of the diamonds. The diamonds are decolorized near or below atmospheric pressure, which prevent damage to the diamonds. Further, the use of pressures near or below atmospheric pressure prevents development of cracks in the diamonds. The use of pressures near or below atmospheric pressure also prevents breakages of the parts of a system used for decolorizing of diamonds, which reduces the cost of operating the method. Furthermore, the method enables uniform decolorization of the diamond.

BRIEF DESCRIPTION OF THE DRAWINGS

Various embodiments of the invention will hereinafter be described in conjunction with the appended drawings provided to illustrate and not to limit the invention, wherein like designations denote like elements, and in which.

DETAILED DESCRIPTION

For the sake of convenience, the terms used to describe various embodiments are described below. It should be understood that these are provided to merely aid the understanding of the description, and that definitions in no way limit the scope of the invention.

Natural diamond: A diamond formed naturally within the earth by prolonged exposure of carbon-bearing materials to high pressure and temperature.

Synthetic diamond: A man-made diamond with all the physical and chemical properties of a natural diamond.

Type Ia diamond: About 98 percent of natural diamonds are Type Ia, which are characterized by the presence of nitrogen in fairly substantial amount (up to 3000 ppm). Nitrogen is distributed in small aggregates substituting for the neighboring carbon atoms.

Type Ib diamond: Type Ib diamonds are less than 1 percent in nature. In these diamonds, nitrogen is dispersed through the crystal structure as single-substituting atoms.

Type IIa diamond: Type IIa diamonds are rare (1-2 percent) in nature. They are characterized by Nitrogen impurity levels, which are below the levels that can be detected by standard infrared techniques.

Type IIb diamond: Type IIb diamonds are extremely rare (0.1 percent) in nature. They have boron as an impurity, which gives the diamond a blue color.

Colored diamond: Diamonds with a detectable hue to them. They contain impurities or structural defects that cause the coloration.

High pressure high temperature (HPHT): A process in which a diamond is treated at high temperatures (of about 1700° C. to 2300° C.) and high pressures (of few gigapascals) in the P-T stability region of the diamond.

Chemical vapor deposition (CVD): A process for depositing films of various materials near or below atmospheric pressure. In a typical CVD process, the substrate is exposed to one or more volatile precursors, which react and/or decompose on the substrate surface to produce the desired deposit. Volatile byproducts are also produced frequently, which are removed by a gas flowing through the reaction chamber.

Colorless: A diamond with no body color, and which is completely transparent.

The invention provides a method for decolorizing/changing the color of diamonds at high temperatures (above 1400° C.) and at pressures near or below atmospheric pressure in a CVD equipment. The essential method steps and various embodiments of the invention are described in detail with reference to the flowchart and the drawings.

Figure 1:
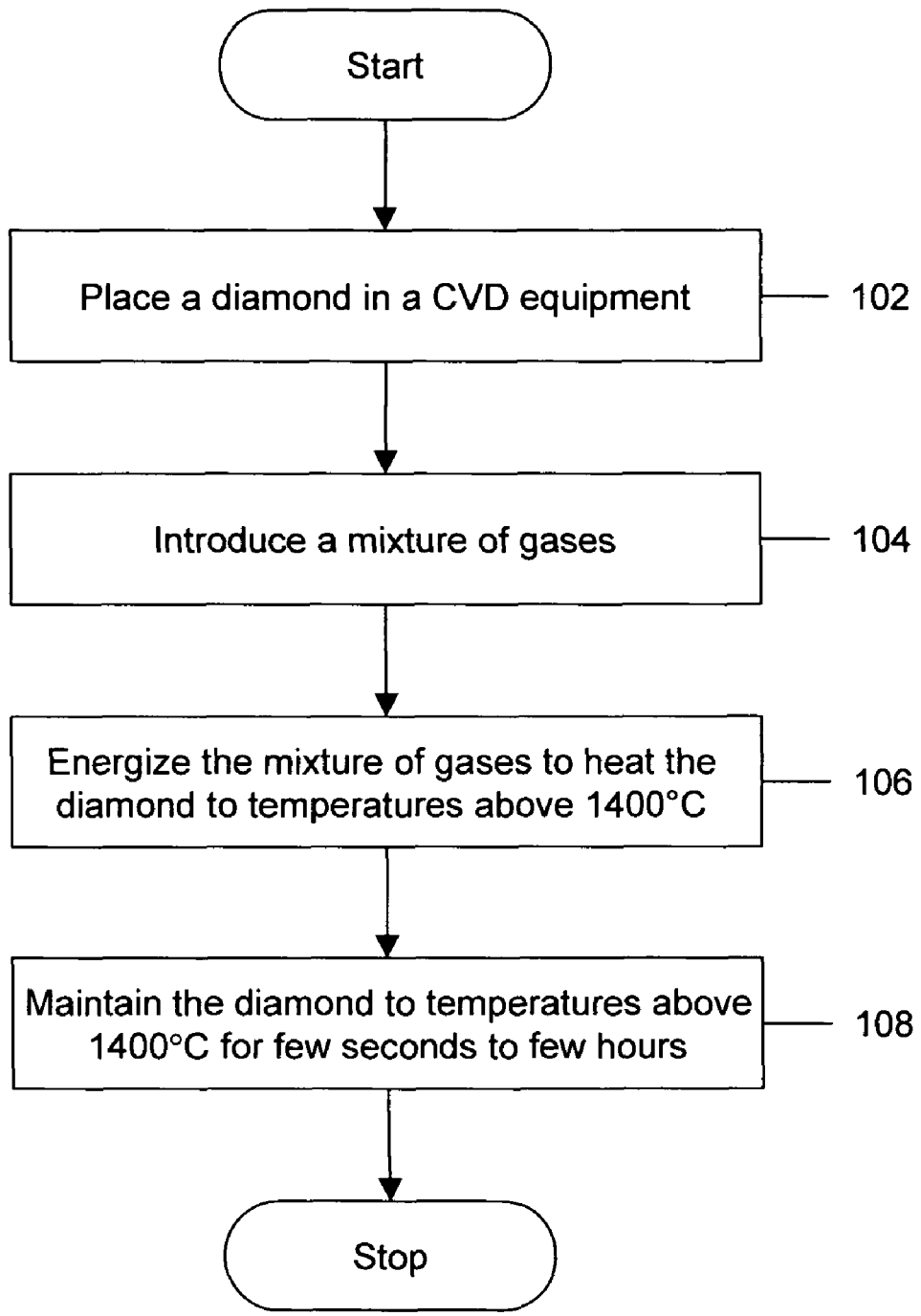
FIG. 1 is a flowchart illustrating a method for decolorizing/changing the color of a diamond, in accordance with various embodiments of the invention.

FIG. 1 is a flowchart illustrating a method for decolorizing/changing the color of a diamond, in accordance with various embodiments of the invention. At step 102, a diamond to be decolorized is held in a substrate holder and placed in the CVD equipment. The present invention is capable of being applied to various types of diamonds, ranging from natural to synthetic diamonds. In accordance with various embodiments of the invention, different Type I diamonds and Type II diamonds can be decolorized. Type Ia diamonds contain a nitrogen impurity that exists in an agglomerated state. The agglomerated state exists as nitrogen pairs, called 'A centers' (Type IaA), nitrogen clusters comprising four nitrogen atoms called 'B centers' (Type IaB), and mixtures thereof (Type IaA/B). Type Ib diamonds contain nitrogen as isolated single nitrogen atoms called 'C centers'. Some Type I diamonds may also contain clusters of three nitrogen atoms called 'N3 centers'. Type II diamonds are conventionally defined as diamonds that contain less than 1 parts per million (ppm) of nitrogen. Type II diamonds are further divided into Type IIa and Type IIb. Type IIa diamonds have no impurities other than nitrogen, which is also at less than a 1 ppm level. Type II diamonds contain boron in the parts per million range and the boron concentration exceeds any nitrogen concentration in the crystal. Type IIb diamonds are blue in color and are extremely rare.

In accordance with an embodiment of the invention, the method is used for decolorizing brown-colored diamonds, which are of a lesser economic value.

In accordance with an embodiment of the invention, the diamond to be decolorized is pre-treated with gamma radiation before being placed in the CVD equipment.

In accordance with various embodiments of the invention, the substrate holder should be thermally and chemically stable at high temperatures to the order of 2400° C. The substrate holder can be made from a suitable material, such as hexagonal boron nitride, hexagonal boron nitride previously coated with diamond, silicon carbide and molybdenum. However, the invention should not be construed to be limited only to the use of a substrate holder, made of hexagonal boron nitride, hexagonal boron nitride previously coated with diamond, silicon carbide and molybdenum. Other substrate holders, which are thermally and chemically stable at high temperatures can also be used.

The CVD equipment is a pressure sealed equipment, which is maintained near or below atmospheric pressure. The use of pressures near or below atmospheric pressure avoids mechanical damage to the diamond placed inside the CVD equipment. In accordance with an embodiment of the invention, the CVD equipment is maintained in a pressure range of 50 torr to 250 torr. In accordance with another embodiment of the invention, the CVD equipment is maintained at one atmospheric pressure. In accordance with still another embodiment of the invention, the CVD equipment is maintained at pressures higher than 250 torr. In accordance with various embodiments of the invention, the CVD equipment is a microwave plasma assisted CVD (MPCVD) equipment. While CVD equipment is a preferred means of carrying out the process any equipment capable of providing a sealed chamber and a source of radiation, and generating of a plasma may also be used.

At step 104, a mixture of gases is introduced in the CVD equipment. The mixture of gases essentially contains hydrogen gas. In accordance with an embodiment of the invention, the mixture of gases contains hydrogen gas and a hydrocarbon gas, such as methane. In accordance with another embodiment of the invention, the mixture of gases contains hydrogen gas and argon gas. In accordance with still another embodiment of the invention, the mixture of gases contains only hydrogen gas. However, the invention should not be construed to be limited to the use of the above-mentioned mixture of gases only. Other gases, such as argon, oxygen, or gases containing sulfur and phosphorous can also be used with hydrogen without deviating from the scope of the invention.

At step 106, the introduced mixture of gases is energized by using microwave radiation to heat the diamond. In accordance with one embodiment of the invention, the diamond can be further heated by using a laser. In accordance with another embodiment of the invention, resistance heating in a hot filament equipment is used to increase the temperature of the diamond. The energizing of the introduced gases increases the temperature of the introduced gases. The increase in temperature of the introduced gases results in the formation of a plasma of introduced gases. The plasma of introduced gases essentially contains atomic hydrogen plasma, due to the presence of higher percentage of hydrogen gas in the introduced mixture of gases. The created plasma of introduced gases raises the temperature of the diamond placed in the CVD equipment in the range of 1400° C. to 2400° C. Further, the atomic hydrogen plasma stabilizes the diamond, thereby preventing graphitization of the diamond. In accordance with one embodiment of the invention, plasma is created by adding argon with hydrogen gas as the carrier gas, and is used to heat the diamond.

In accordance with various embodiment of the invention, the diamond held in the substrate holder is heated gradually from the ambient temperature to the temperature ranging from 1400° C. to 2400° C. in the CVD equipment.

In accordance with an embodiment of the invention, laser energy is used to raise the temperature of the diamond. The laser energy is focused on the diamond placed in the CVD equipment to raise the temperature of the diamond to about 1600° C. to 2400° C. Examples of laser include, but are not limited to, a $CO_2$ laser, a Nd:YAG laser and a $Cr:Al_2O_3$ laser.

At step 108, the diamond is maintained at temperatures ranging from 1400° C. to 2400° C. for time period ranging from a few seconds to a few hours. The time period depends on the temperature range in which the diamond is maintained. It will be apparent to a person skilled in the art that at high temperatures, the time period for which the diamond is to be maintained reduces, as compared to low temperatures. In accordance with an embodiment of the invention, the temperature at which the diamond is maintained can be varied with time. This is achieved by adjusting the microwave power of the CVD equipment. For example, the diamond held in the substrate holder is heated to 1600° C., and is maintained at this temperature for 5 minutes. After 5 minutes, the diamond is further heated to 1700° C., and is maintained at this temperature for 1 minute. After 1 minute, the temperature of the diamond is lowered to 1600° C., and is maintained at this temperature for 5 minutes. This has been explained in conjunction with example 2.

At temperatures above 1400° C., the mobility of atoms in the diamond increases. The increased mobility of the atoms results in the migration of nitrogen atoms (responsible for color of the diamond) present in the diamond. The nitrogen atoms migrate to form aggregates of nitrogen atoms. The formation of aggregates of nitrogen atoms results in decolorizing of the diamond.

The decolorized diamond is finally cooled to ambient temperature. In order to achieve this, the power supplied to the CVD equipment is gradually reduced to zero. In accordance with one embodiment of the invention, the diamond is cooled by switching off the power supplied to the CVD equipment. The diamond is cooled down to ambient temperature, and the pressure inside the CVD equipment is brought to ambient pressure.

In accordance with various embodiments of the invention, the method as illustrated in FIG. 1 can be used to decolorize a diamond to various grades of colorlessness. In accordance with one embodiment of the invention, the diamond is decolorized to colorless grades of diamond, such as D, E and F grades. The D and E grades of diamond virtually contain no color. The F grade of diamond contains very slight hues of color. In accordance with another embodiment of the invention, the diamond is decolorized to near colorless grades of diamond, such as G, H and I grades. The G, H and I grades of diamond exhibit a very light shade of color. In accordance with still another embodiment of the invention, the diamond is decolorized to faint yellow grades of diamond.

In accordance with other embodiments of the invention, the method as illustrated in FIG. 1 can also be used for changing the color of the diamonds. In accordance with one embodiment of the invention, the method is used for changing the color of Type IIa diamonds to colorless. In accordance with another embodiment of the invention, the method is used for changing the color of Type Ia and Type Ib diamonds from brown to green, yellow or orange.

Figure 2:
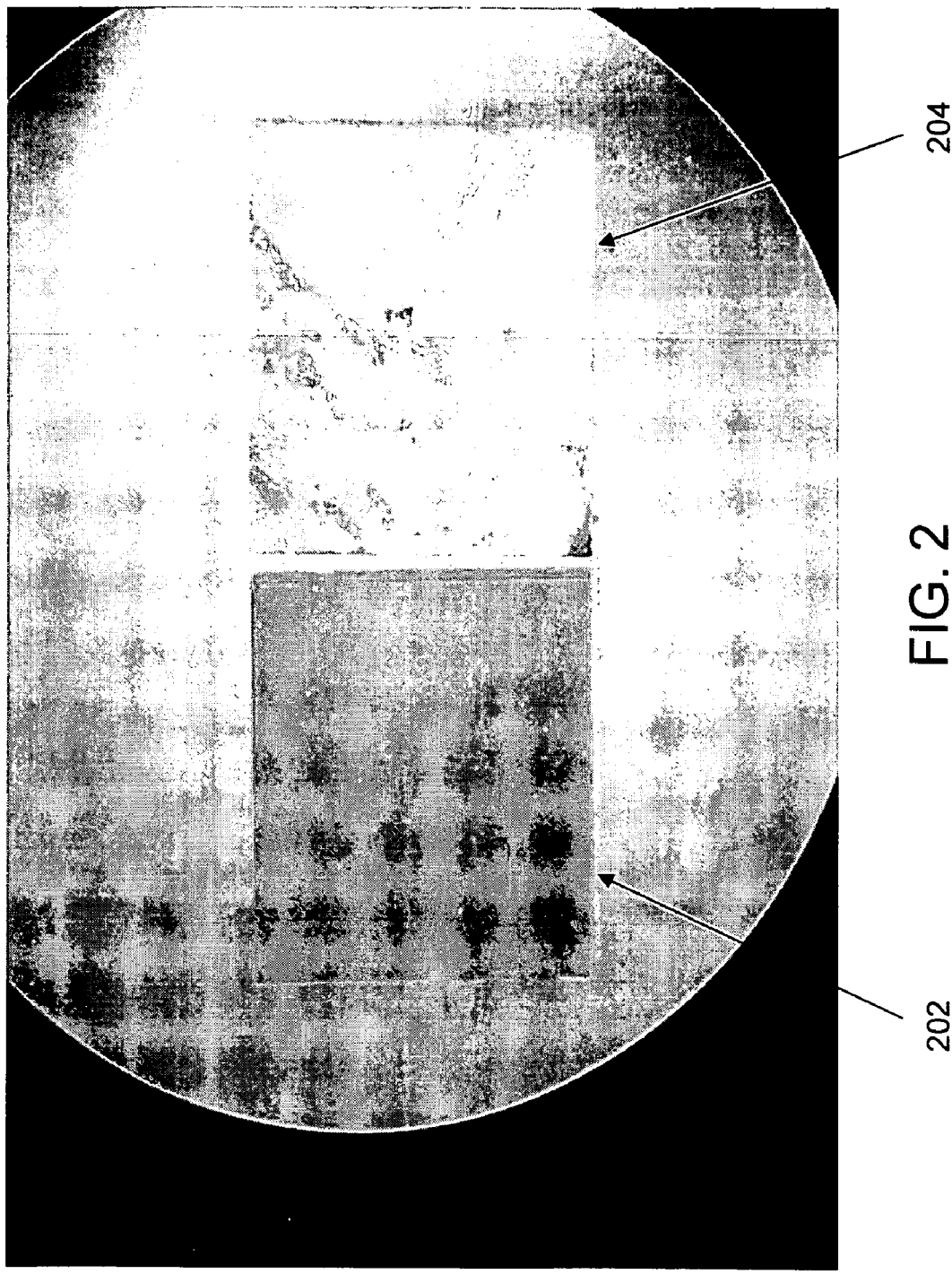
FIG. 2 is a photograph showing a CVD grown brown diamond decolorized to a colorless diamond, in accordance with an embodiment of the invention.

FIG. 2. is a photograph showing a CVD grown brown diamond decolorized to a colorless diamond, in accordance with an embodiment of the invention. As shown in FIG. 2, a CVD grown brown diamond 202 is decolorized to a colorless diamond 204 using hydrogen plasma generated by microwave radiation in a CVD equipment. This has been explained in conjunction with example 1.

Figure 3:
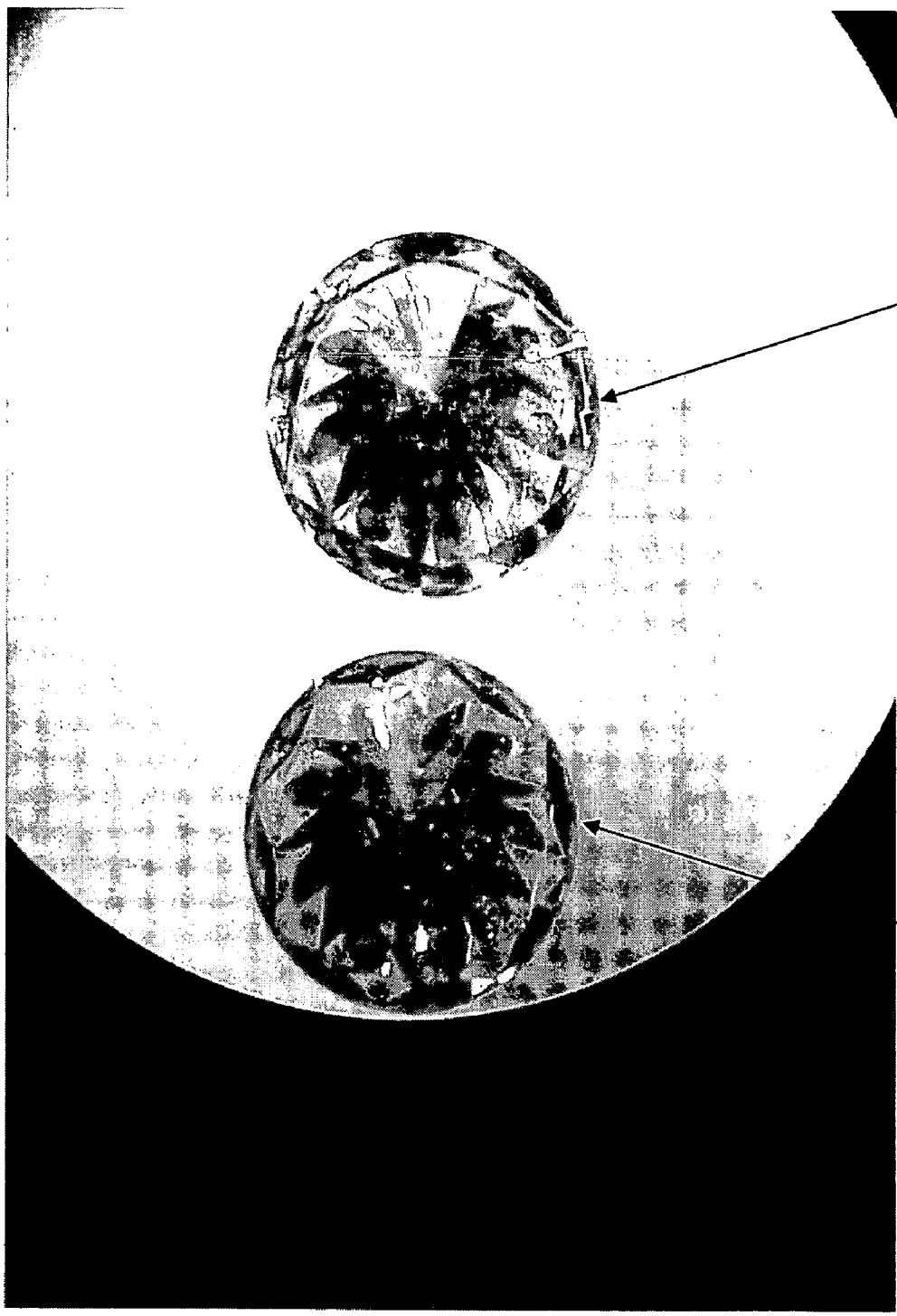
FIG. 3 is a photograph showing a natural brown diamond pre-treated with gamma radiation decolorized to a light brown diamond, in accordance with an embodiment of the invention.

FIG. 3 is a photograph showing a natural brown diamond pre-treated with gamma radiation decolorized to a light brown diamond, in accordance with an embodiment of the invention. As shown in FIG. 3, a natural brown diamond 302 which is pre-treated with gamma radiation is decolorized to a light brown diamond 304. This has been explained in conjunction with example 5.

Figure 4:
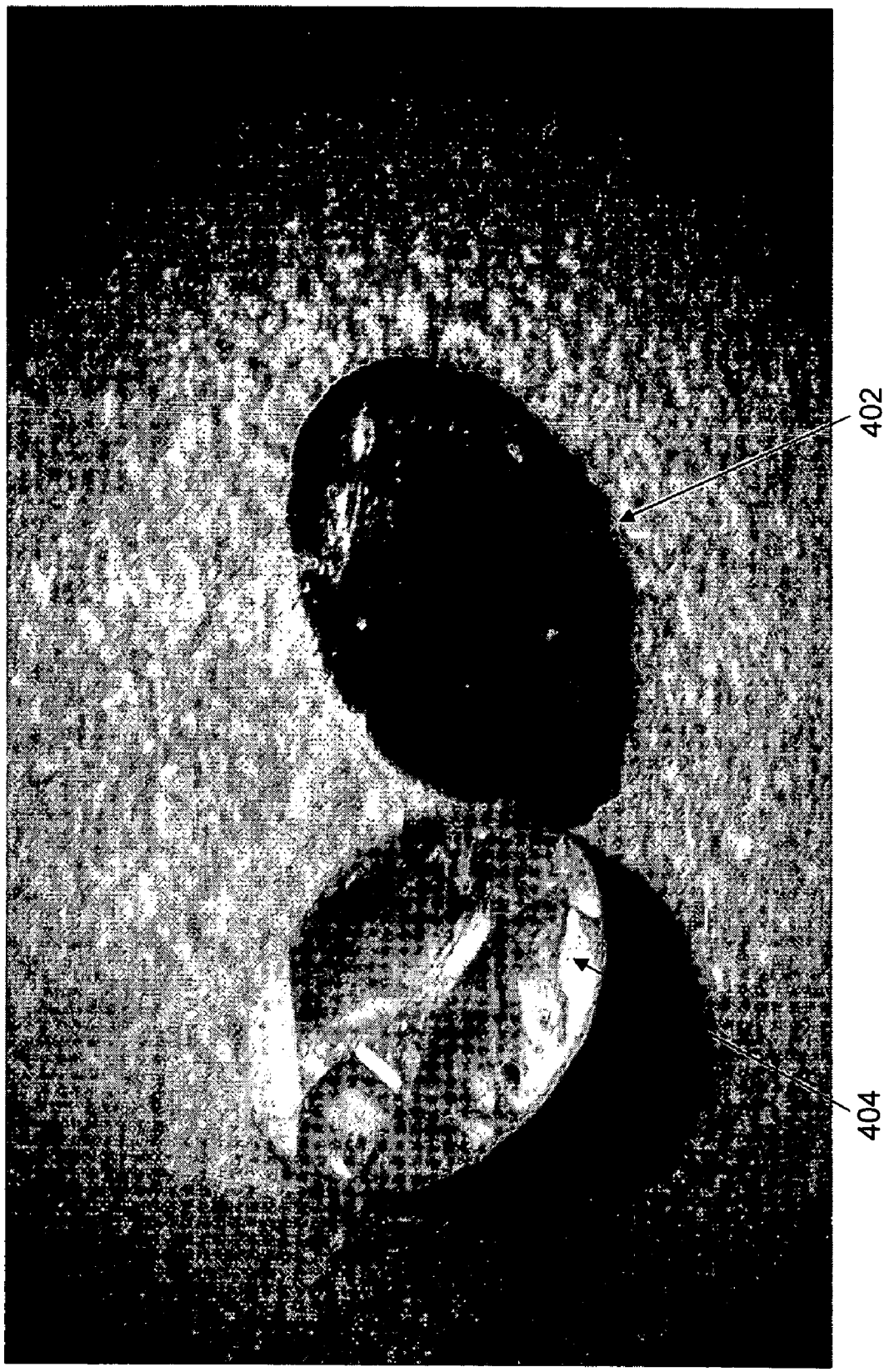
FIG. 4 is a photograph showing a black diamond converted to a yellow diamond, in accordance with an embodiment of the invention.

FIG. 4 is a photograph showing a black diamond converted to a yellow diamond, in accordance with an embodiment of the invention. As shown in FIG. 4, a black diamond 402 is converted to a yellow diamond 404 using hydrogen plasma generated by microwave radiation in a CVD equipment.

Figure 5:
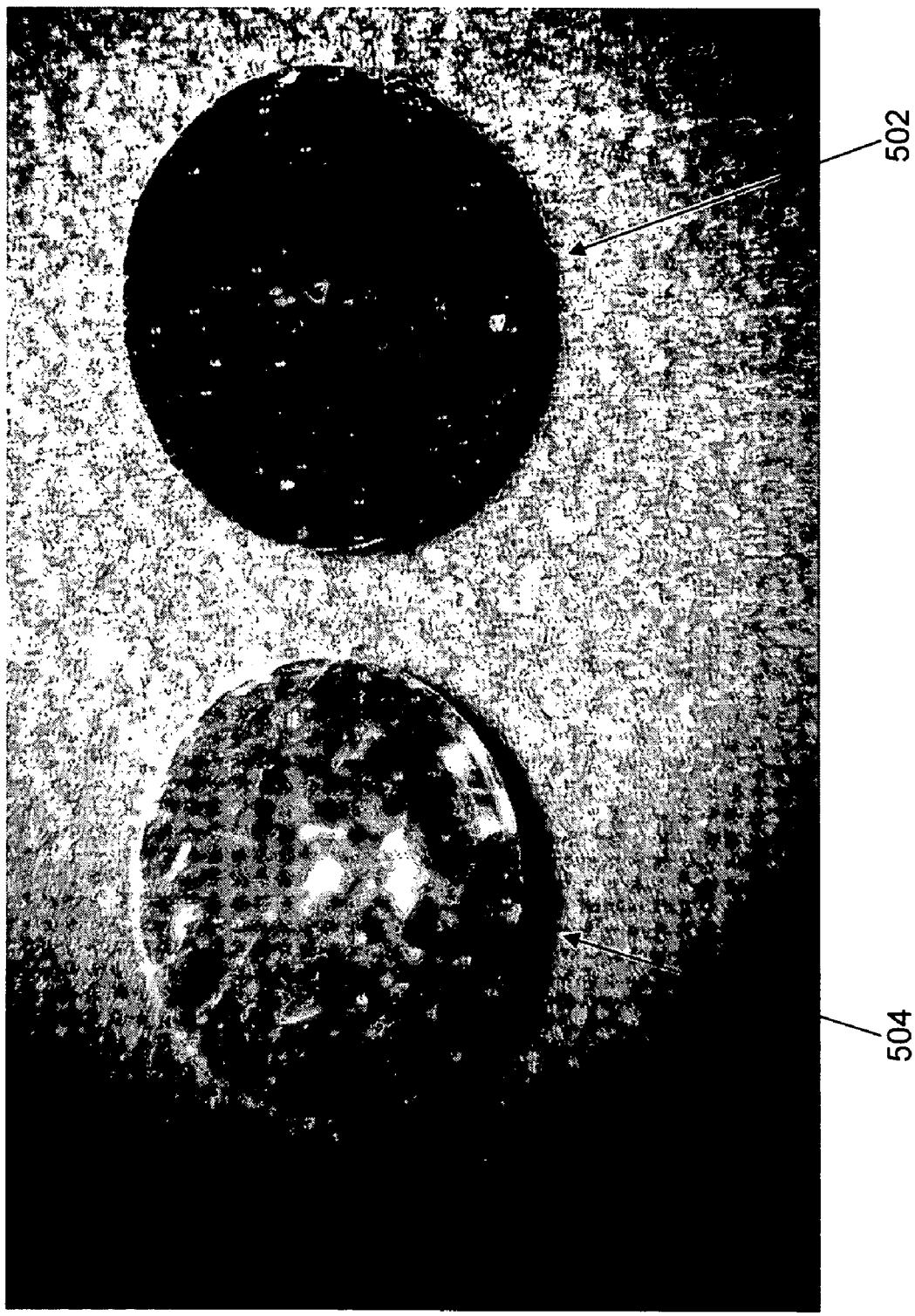
FIG. 5 is a photograph showing a natural black diamond converted to a green diamond, in accordance with an embodiment of the invention.

FIG. 5 is a photograph showing a natural black diamond converted to a green diamond, in accordance with an embodiment of the invention. As shown in FIG. 5, a natural black diamond 502 is converted to a green diamond 504 using hydrogen plasma generated by microwave radiation in a CVD equipment. This has been explained in conjunction with example 3.

Figure 6:
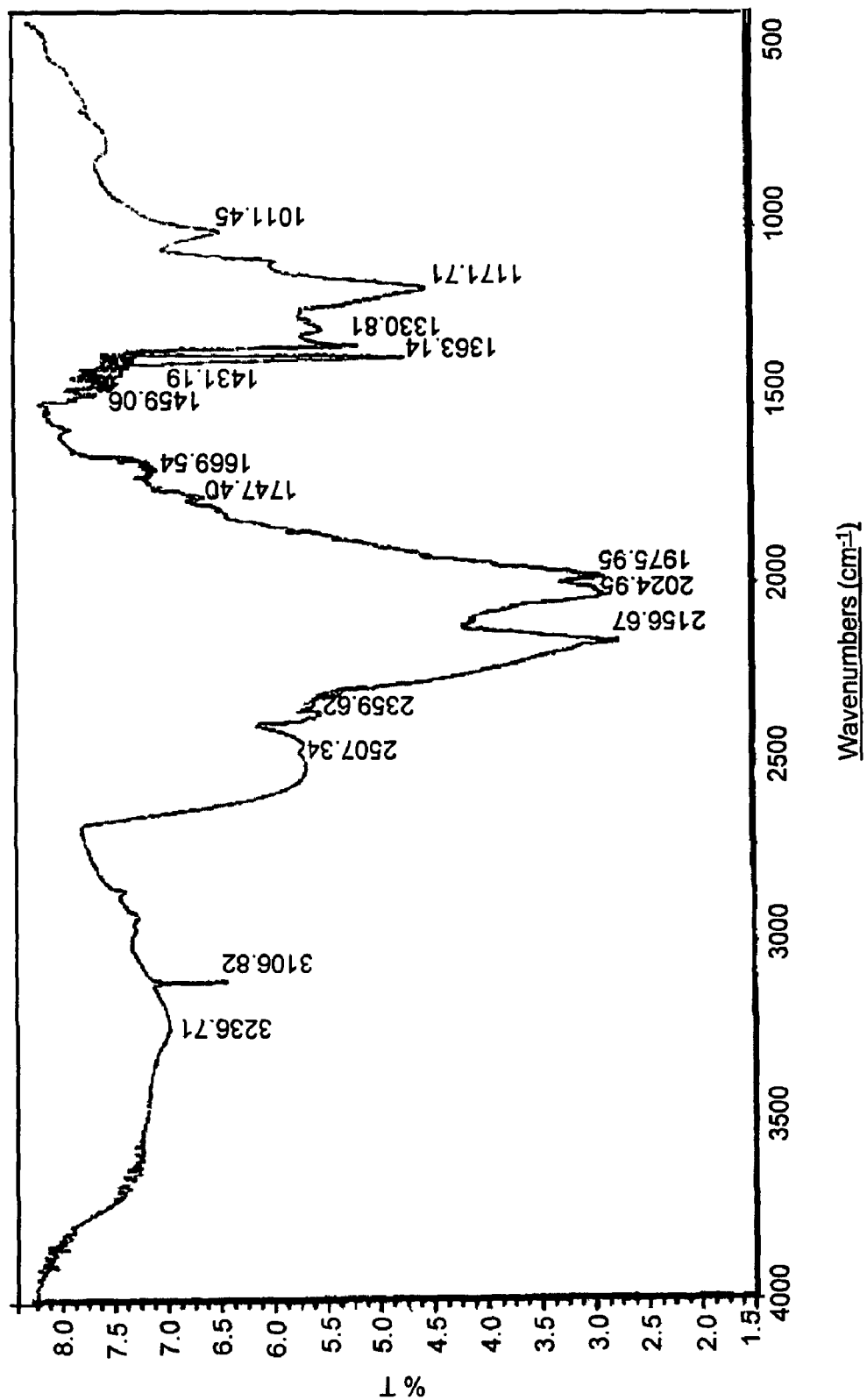
FIG. 6 is a graph illustrating the FTIR spectrum of a CVD grown brown diamond before it has undergone microwave hydrogen plasma treatment in a CVD equipment, in accordance with an embodiment of the invention.

FIG. 6 is a graph illustrating the FTIR spectrum of a CVD grown brown diamond before it has undergone microwave hydrogen plasma treatment in a CVD equipment, in accordance with an embodiment of the invention. FIG. 6 shows a sharp dip in the transmittance at 3106.82 $cm^{-1}$, a broad dip at 3236.71 $cm^{-1}$, and two small dips at around 2900 $cm^{-1}$.

Figure 7:
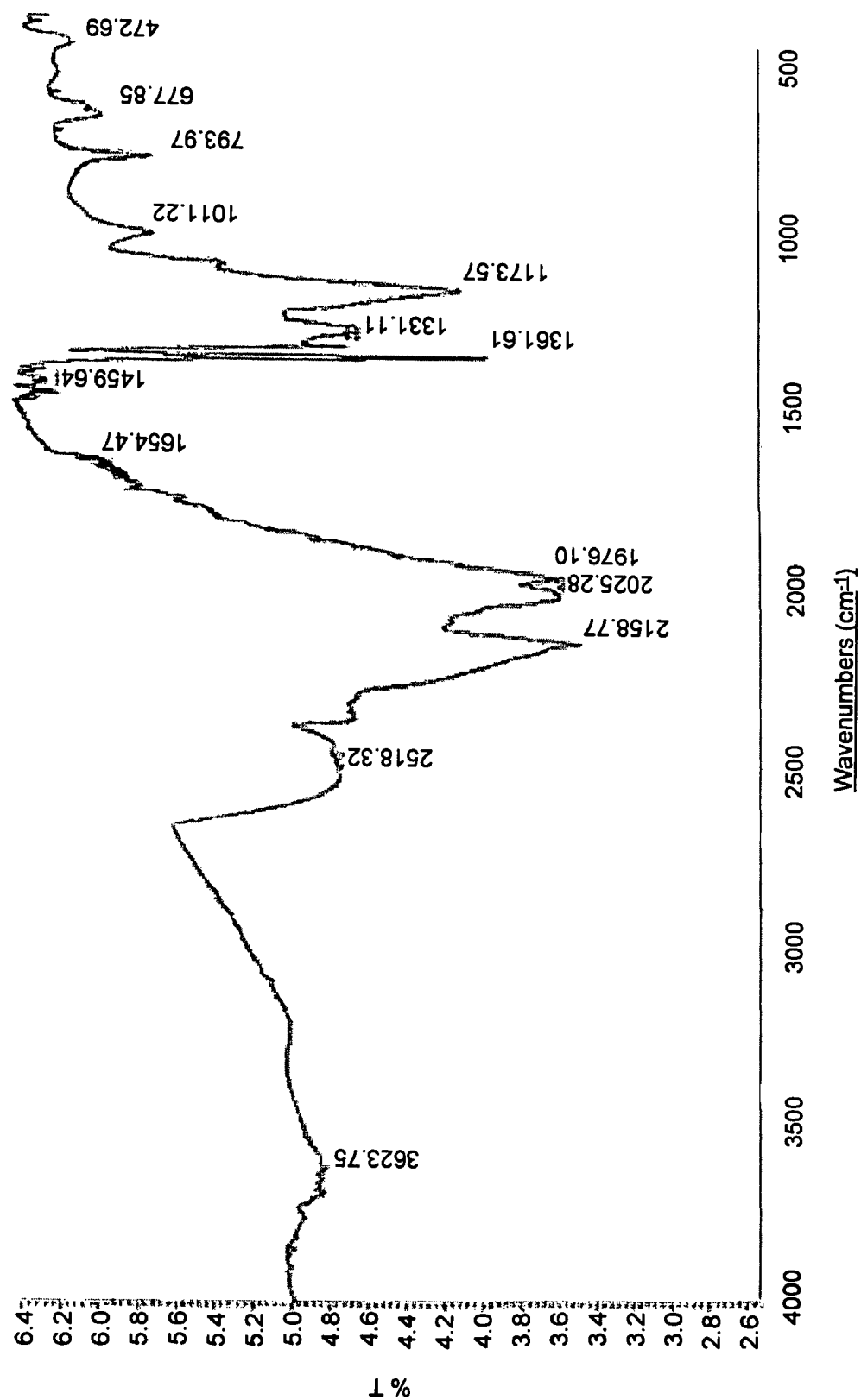
FIG. 7 is a graph illustrating the FTIR spectrum of a CVD grown brown diamond after it has undergone microwave hydrogen plasma treatment in a CVD equipment, in accordance with an embodiment of the invention.

FIG. 7 is a graph illustrating the FTIR spectrum of a CVD grown brown diamond after it has undergone microwave H-plasma treatment in a CVD equipment, in accordance with an embodiment of the invention. FIG. 7 shows the new spectral lines produced at 1011.22 $cm^{-1}$, 793.97 $cm^{-1}$, 677.85 $cm^{-1}$ and 472.63 $cm^{-1}$, which fall in the longer wavelength range of the spectrum, and a downward slope of the spectrum at 3600 $cm^{-1}$. All these changes in the FTIR spectrum, as compared to the FTIR spectrum in FIG. 6, indicate a change in the color of the CVD grown brown diamond after it has undergone microwave hydrogen plasma treatment in the CVD equipment.

The following non-limiting examples are provided to illustrate the present invention:

Example 1

Decolorizing of a CVD Grown Brown Diamond to a Colorless Diamond

A CVD grown brown diamond is placed in a CVD equipment. The CVD grown brown diamond is held in a substrate holder in the CVD equipment. The CVD equipment is maintained at a pressure of 200 torr. Hydrogen gas is introduced inside the CVD equipment at 500 cubic centimeter per minute (ccm). The hydrogen gas is energized to heat the CVD grown brown diamond to 1600° C. Thereafter, the CVD grown brown diamond is maintained at the temperature of 1600° C. for 30 minutes. This leads to the decolorizing of the CVD grown brown diamond to a colorless diamond.

Example 2

Decolorizing of a CVD Grown Dark Brown Diamond to a Colorless Diamond

A CVD grown dark brown diamond is placed in a CVD equipment. The CVD grown dark brown diamond is held in a substrate holder in the CVD equipment. The CVD equipment is maintained at a pressure of 200 torr. Hydrogen gas is introduced inside the CVD equipment at 500 ccm. The hydrogen gas is energized to heat the CVD grown dark brown diamond to 1600° C. The CVD grown dark brown diamond is maintained at temperature of 1600° C. for 5 minutes. After 5 minutes, the CVD grown dark brown diamond is further heated to 1700° C., and is maintained at this temperature for 1 minute. After 1 minute, the temperature of CVD grown dark brown diamond is lowered to 1600° C. and is maintained at this temperature for 5 minutes. This leads to the decolorizing of the CVD grown dark brown diamond to a colorless diamond.

Example 3

Conversion of a Natural Black Diamond to a Green Diamond

A natural black diamond is placed in a CVD equipment. The natural black diamond is held in a substrate holder in the CVD equipment. The CVD equipment is maintained at a pressure of 0.180 torr. Hydrogen gas is introduced inside the CVD equipment at 500 ccm. The hydrogen gas is energized to heat the natural black diamond to 1450° C. Thereafter, the natural black diamond is maintained at the temperature of 1450° C. for 10 minutes. This leads to the conversion of the natural black diamond to a green diamond.

Example 4

Decolorizing of a CVD Grown Dark Brown Diamond to a Colorless Diamond

A CVD grown dark brown diamond is placed in a CVD equipment. The CVD grown dark brown diamond is held in a substrate holder in the CVD equipment. The CVD equipment is maintained at a pressure of 210 torr. Hydrogen gas is introduced inside the CVD equipment at 500 ccm. The hydrogen gas is energized to heat the CVD grown dark brown diamond. The CVD grown dark brown diamond is simultaneously heated using Nd:Yag laser to 1780° C. Thereafter, the CVD grown dark brown diamond is maintained at the temperature of 1780° C. for 5 minutes. This leads to the decolorizing of the CVD grown dark brown diamond to a colorless diamond.

Example 5

Decolorizing of a Natural Brown Diamond Pre-Treated with Gamma Radiation to a Light Brown Diamond A natural brown diamond pre-treated with gamma radiation is placed in a CVD equipment. The natural brown diamond pre-treated with gamma radiation is held in a substrate holder in the CVD equipment. The CVD equipment is maintained at a pressure of 200 torr. Hydrogen gas is introduced inside the CVD equipment at 500 ccm. The hydrogen gas is energized to heat the natural brown diamond pre-treated with gamma radiation to 1800° C. Thereafter, the natural brown diamond pre-treated with gamma radiation is maintained at the temperature of 1800° C. for 30 minutes. This leads to the decolorizing of the natural brown diamond pre-treated with gamma radiation to a light brown diamond.

It will be evident to a person ordinarily skilled in the art that one or more of the embodiments mentioned above provide the following advantages for decolorizing diamonds. The method enables decolorizing of diamonds in a CVD equipment at pressures near or below atmospheric pressure, without damaging the diamonds. The diamonds are decolorized by heating the diamonds in the atomic hydrogen plasma. The atomic hydrogen plasma stabilizes the diamonds, thereby preventing graphitization of the diamonds. This prevents the formation of a black layer on the surface of the diamonds. The diamonds are decolorized at pressures near or below atmospheric pressure, which prevent damage to the diamonds as well as development of cracks in the diamonds. The use of pressures near or below atmospheric pressure further prevents breakages of the parts of equipment used for decolorizing of diamonds, which reduces the cost of operating the method. Furthermore, the method enables uniform decolorization of the diamonds.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for decolorizing a chemical vapor deposition (CVD) grown diamond to colorless/near colorless grades D through I, the method comprising the steps of:
    a. placing the CVD grown diamond in a sealed chamber, wherein the CVD grown diamond is held in a substrate holder in the sealed chamber, wherein the sealed chamber is maintained at pressures in the range of about 50 torr to about 250 torr;
    b. introducing hydrogen gas inside the sealed chamber;
    c. energizing the at least one of hydrogen and argon gas by microwave radiation, the energized gas heating the CVD grown diamond to increase the temperature of the diamond above 1400° C.; and
    d. maintaining the CVD grown diamond at temperatures above 1400° C. for a few seconds to a few hours.

2. The method according to claim 1 wherein the CVD grown diamond is heated to the temperature in the range of above 1400° C. to 2400° C.

3. The method according to claim 1 wherein further to step c the CVD grown diamond is heated by focusing laser energy on the CVD grown diamond to increase the temperatures, wherein the laser being at least one of a $CO_2$ laser, a YAG laser and $Al_2O_3$ laser.

4. The method according to claim 3 wherein focusing the laser energy on the CVD grown diamond raises the temperature of the CVD grown diamond in the range of 1600° C. to 2400° C.

5. The method according to claim 1 further comprising the step of varying the temperature of the CVD grown diamond with time.

6. The method according to claim 1 further comprising pre-treating the CVD grown diamond with gamma radiation before being placed in the sealed chamber.

7. A method for decolorizing a natural diamond, to colorless/near colorless grades D through I the method comprising the steps of:
    a. placing the natural diamond in a sealed chamber, wherein the natural diamond is held in a substrate holder in the sealed chamber, wherein the sealed chamber is maintained at pressures in the range of about 50 torr to about 250 torr;
    b. introducing hydrogen gas inside the sealed chamber;
    c. energizing the at least one of hydrogen and argon gas by microwave radiation, the energized gas heating the natural diamond to increase the temperatures of the natural diamond above 1400° C.; and
    d. maintaining the natural diamond at temperatures above 1400° C. for a few seconds to a few hours.

8. The method according to claim 7 further comprising pre-treating the natural diamond with gamma radiation before being placed in the sealed chamber.

9. The method according to claim 7 wherein further to step c the natural diamond is being heated by focusing laser energy on the natural diamond to increase the temperatures, wherein the laser being at least one of a $CO_2$ laser, a YAG laser and Al2o3 laser.

10. The method according to claim 7 further comprising the step of varying the temperature of the natural diamond with time.

11. The method according to claim 1 further including the step of introducing argon gas along with the hydrogen gas inside the sealed chamber.

12. The method according to claim 7 further including the step of introducing argon gas along with the hydrogen gas inside the sealed chamber.

* * * * *